(12) United States Patent
Chiang et al.

(10) Patent No.: US 7,927,425 B2
(45) Date of Patent: Apr. 19, 2011

(54) POWER-DELIVERY MECHANISM AND APPARATUS OF PLASMA-ENHANCED CHEMICAL VAPOR DEPOSITION USING THE SAME

(75) Inventors: Yuan-Yuan Chiang, Taichung (TW); Kuan-Chou Chen, Hsinchu (TW); Fu-Ching Tung, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 902 days.

(21) Appl. No.: 11/847,316

(22) Filed: Aug. 29, 2007

(65) Prior Publication Data
US 2008/0295771 A1 Dec. 4, 2008

(30) Foreign Application Priority Data

May 30, 2007 (TW) ................. 96119236 A (51) Int. Cl.
*C23C 16/00* (2006.01)
*C23C 16/458* (2006.01)
*C23C 16/509* (2006.01)
*H01L 21/3065* (2006.01)

(52) U.S. Cl. ..... 118/729; 118/715; 118/728; 118/723 E; 118/712; 156/345.47; 156/345.51; 156/345.54

(58) Field of Classification Search ................. 118/712, 118/715, 723 E, 728, 729; 156/345.47, 345.51, 156/345.54
See application file for complete search history.

(56) References Cited

U.S. PATENT DOCUMENTS

| | | | | |
|---|---|---|---|---|
| 5,558,717 A | * | 9/1996 | Zhao et al. ..................... 118/715 |
| 5,772,773 A | * | 6/1998 | Wytman ........................ 118/729 |
| 5,853,607 A | * | 12/1998 | Zhao et al. .......................... 252/8 |
| 5,911,834 A | * | 6/1999 | Fairbairn et al. ................ 134/1.3 |
| 6,103,304 A | | 8/2000 | Mizuno |
| 6,120,609 A | * | 9/2000 | Selyutin et al. ................ 118/728 |
| 6,142,096 A | | 11/2000 | Sakai et al. |
| 6,676,761 B2 | * | 1/2004 | Shang et al. ................... 118/728 |
| 6,767,176 B2 | * | 7/2004 | Yudovsky et al. ............. 414/672 |
| 7,160,392 B2 | * | 1/2007 | Shang et al. ................... 118/728 |
| 7,189,313 B2 | * | 3/2007 | Lubomirsky ................... 204/212 |
| 7,857,947 B2 | * | 12/2010 | Ritchie et al. ............ 204/192.15 |
| 2002/0050246 A1 | * | 5/2002 | Parkhe ........................... 118/500 |
| 2002/0174950 A1 | * | 11/2002 | Park ............................ 156/345.1 |
| 2003/0000775 A1 | * | 1/2003 | Yudovsky et al. ............. 187/250 |
| 2003/0209443 A1 | * | 11/2003 | Lubomirsky ................... 205/137 |
| 2004/0020601 A1 | * | 2/2004 | Zhao et al. ................ 156/345.32 |

(Continued)

FOREIGN PATENT DOCUMENTS

JP 11302829 A 11/1999

(Continued)

*Primary Examiner* — Jeffrie R Lund
(74) *Attorney, Agent, or Firm* — WPAT., P.C.; Justin King (57) ABSTRACT

A power-delivery mechanism is provided in the present invention, which utilizes an element with airtight and flexible characteristics coupled to a power-generating unit so as to generate a motion in a specific direction. Besides, an apparatus of plasma-enhanced chemical vapor deposition (PECVD) is also provided in the present invention, which comprises the power-delivery mechanism to load/unload a workpiece onto a stage for processing automatically. Meanwhile, the present invention also provides a height-adjusting unit and a position-indicating unit allowing the operator to adjust the distance between an upper electrode and a lower electrode of the PECVD so that the operator is capable of monitoring and adjusting the distance easily between the upper electrode and the lower electrode outside the chamber of the PECVD.

16 Claims, 12 Drawing Sheets

U.S. PATENT DOCUMENTS

| | | | |
|---|---|---|---|
| 2004/0026041 A1* | 2/2004 | Yamagishi | 156/345.54 |
| 2004/0058067 A1* | 3/2004 | Law et al. | 427/240 |
| 2004/0089239 A1* | 5/2004 | Shang et al. | 118/729 |
| 2004/0129211 A1* | 7/2004 | Blonigan et al. | 118/715 |
| 2004/0177813 A1* | 9/2004 | Schieve et al. | 118/728 |
| 2004/0221808 A1 | 11/2004 | Kawano | |
| 2005/0217586 A1* | 10/2005 | Lubomirsky et al. | 118/729 |
| 2006/0175011 A1* | 8/2006 | Shinriki et al. | 156/345.29 |
| 2006/0238953 A1* | 10/2006 | Hanawa et al. | 361/234 |
| 2006/0240542 A1* | 10/2006 | Schieve et al. | 435/287.2 |
| 2006/0281310 A1* | 12/2006 | Smith et al. | 438/680 |
| 2007/0031609 A1* | 2/2007 | Kumar et al. | 427/569 |
| 2007/0089672 A1* | 4/2007 | Shimamura et al. | 118/504 |
| 2007/0218702 A1 | 9/2007 | Shimizu et al. | |
| 2007/0240646 A1* | 10/2007 | Jun | 118/729 |
| 2008/0282982 A1* | 11/2008 | White et al. | 118/723 R |
| 2008/0295771 A1* | 12/2008 | Chiang et al. | 118/712 |
| 2010/0311203 A1* | 12/2010 | Borden et al. | 438/98 |

FOREIGN PATENT DOCUMENTS

| | | |
|---|---|---|
| JP | 200556994 A | 3/2005 |
| JP | 2007-36070 A * | 2/2007 |

* cited by examiner

POWER-DELIVERY MECHANISM AND APPARATUS OF PLASMA-ENHANCED CHEMICAL VAPOR DEPOSITION USING THE SAME

FIELD OF THE INVENTION

The present invention relates to a power-delivery mechanism, and more particularly, to a power-delivery mechanism capable of utilizing the cooperation of an airtight flexible element and a power-generating unit for generating a motion in a specific direction. In addition, by the aforesaid power-delivery mechanism, an improved plasma-enhanced chemical vapor deposition (PECVD) apparatus is able to load/unload a workpiece automatically onto a stage for processing so that not only the yield will be increased, but also the quality can be improved.

BACKGROUND OF THE INVENTION

With rapid advance of technology, semiconductor products, including solar power products, become more and more important in our daily life. However, even until nowadays, the apparatuses used for manufacturing such products, such as PECVD apparatus, are still monopolized by only a handful of major manufacturers overseas that result in the apparatuses are so expensive that the average-sized companies can't afford them, besides, the specifications of those apparatuses might not be specifically designed to match perfectly with those special processes in solar power industry.

Figure 1:
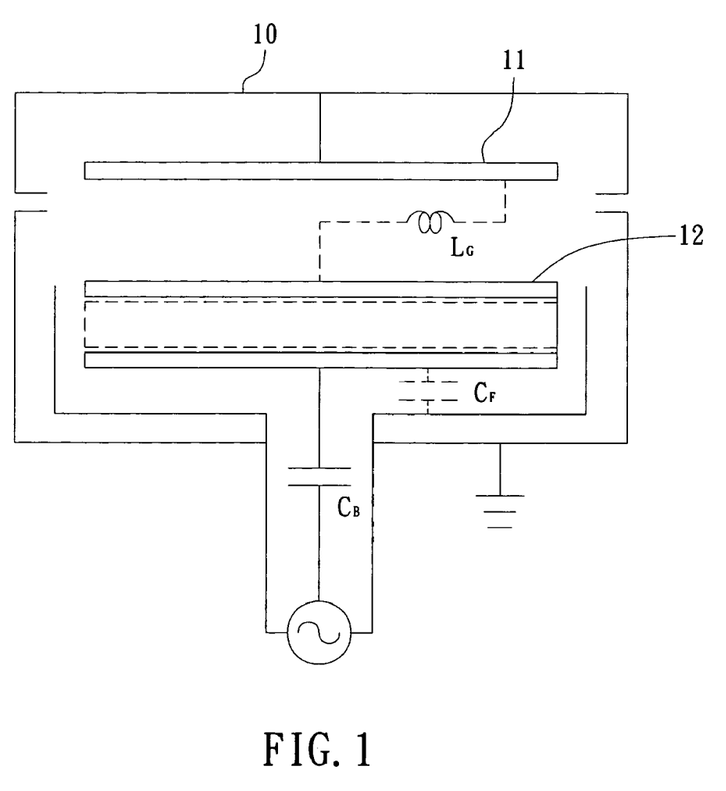
FIG. 1 shows an apparatus of plasma-enhanced chemical vapor deposition (PECVD), disclosed in U.S. Pat. No. 6,142,096.

One of such apparatuses is an apparatus of plasma-enhanced chemical vapor deposition (PECVD), disclosed in U.S. Pat. No. 6,142,096, entitled "Electronic Device Manufacturing Apparatus and Method for Manufacturing Electronic Device", as shown in FIG. 1. The PECVD apparatus of FIG. 1 comprises: a reaction chamber 10; and an upper and a lower electrodes 11, 12, both are installed inside the reaction chamber 10; wherein a reaction gas is fed into the reaction chamber to be used to perform a process of PECVD upon a wafer. Another such an apparatus is a chemical vapor deposition apparatus, disclosed in U.S. Pat. No. 6,103,304. The structure of the aforesaid apparatus is similar to that disclosed in U.S. Pat. No. 6,142,096, with which thin films can be deposited on a substrate by means of a vapor-phase reaction invoked by plasma or heat.

In those prior-art apparatuses, wafers are usually loaded/unload on a wafer carrier manually for facilitating a deposition process can be performed thereon. Thus, as the wafer's loading and unloading are not automatized but are performed manually, they will not only reduce the whole productivity, but also will contaminate the wafers and lower the yield possibly.

Although it is possible to use a robot in loading and unloading, but it is still not popular since the robot's high price and requires a considerable footprint to install the same.

Therefore, it is necessary to design an unexpensive and compact power-delivery mechanism that can be applied in a PECVD apparatus.

SUMMARY OF THE INVENTION

The primary object of the present invention is to provide a power-delivery mechanism combining an airtight flexible element with a power-generating unit to generate a pushing force in a specific direction to drive a workpiece to move accordingly Another object of this invention is to provide an improved plasma-enhanced chemical vapor deposition (PECVD) apparatus capable of controlling a workpiece to be raised/descended by using a power-delivery mechanism, which can further be integrated with an automatized transporting device to facilitate the automation of the wafer's loading/unloading onto the PECVD apparatus. By this way, it will largely reduce the chance of the wafer to be contaminated during loading/unloading, and thus not only will the productivity be improved, but also the yield of the PECVD apparatus can be enhanced.

Furthermore, this invention provides a PECVD apparatus having a height-adjusting unit and a position-indicating unit as well, and both of them are embedded therein, for allowing operators to adjust the distance between the upper electrode and the lower electrode of the PECVD apparatus, and also to monitor the distance between the upper and the lower electrodes from the outside of the chamber of the PECVD apparatus.

In an exemplary embodiment of this invention, a power-delivery mechanism is provided, which comprises: a power unit; an airtight flexible unit, coupled to the power unit for receiving power therefrom; and a supporting pillar, disposed inside the airtight flexible unit in a manner that an end thereof is extended outside the airtight flexible unit.

In an exemplary embodiment of this invention, a PECVD apparatus is provided, which comprises: a chamber; an electrode unit, containing an upper electrode and a lower electrode embedded by a heater while received inside the chamber; at least one power-delivery mechanism, each being arranged outside the chamber and further comprising: a power unit; an airtight flexible unit, coupled to the power unit for transferring power received therefrom so as to use the received power to perform a motion of linear displacement; and a supporting pillar, disposed inside the airtight flexible unit in a manner that it moves with the linear motion of the airtight flexible unit while an end thereof is extended outside the airtight flexible unit; a pushing panel, mounted to the supporting pillar of at least one power-delivery mechanism in a manner that its position is moved with the supporting pillar; at least one lift pin, each piercing through the lower electrode while keeping an end thereof being placed freely on the pushing panel by its own weight; and a wafer carrier, placed on the lower electrode.

In an exemplary embodiment of this invention, a PECVD apparatus is provided, which comprises: a chamber; an electrode unit, structured with an upper electrode and a lower electrode, a heater embedded in it, while installed inside the chamber; at least one power-delivery mechanism, each being arranged outside the chamber; a pushing panel, mounted to a supporting pillar of at least one power-delivery mechanism in a manner that its position is moved with the supporting pillar; at least one lift pin, each piercing through the lower electrode while keeping an end thereof abutting against freely with the pushing panel; a supporting seat, connected with the bottom of the chamber; a height-adjusting unit, capable of controlling the position of the lower electrode as it is disposed inside the supporting seat for supporting the lower electrode; an airtight retractable bush, arranged at a position between the height-adjusting unit and the bottom of the chamber in a manner that the electrode, protruded outside the bottom of the chamber, is allowed to pass through the bush; and a locating ring, abutted against the bottom of the lower electrode.

In an exemplary embodiment of this invention, a PECVD apparatus is provided, which comprises: a chamber; an electrode unit, containing an upper electrode and a lower electrode, a heater embedded in it, while installed inside the chamber; at least one power-delivery mechanism, each being arranged outside the chamber; a pushing panel, mounted on a supporting pillar of the at least one power-delivery mechanism in a manner that its position is moved with the supporting pillar; at least one lift pin, each piercing through the lower electrode while keeping an end thereof abutting against freely with the pushing panel; a wafer carrier, placed on the lower electrode; a supporting seat, connected with the bottom of the chamber; a height-adjusting unit, capable of controlling the position of the lower electrode as it is disposed inside the supporting seat for supporting the lower electrode; a locating ring, abutted against the bottom of the lower electrode; and a position-indicating unit with a scale, mounted on the supporting seat; and a pointer, connected with the locating ring pointing to the graduations of the scale.

Further applicable scopes of the present application will become more apparent from the detailed description given hereinafter. However, it should be understood that the detailed description and specific examples, while indicating the preferred embodiments of this invention, are given by illustration only, since various changes and modifications within the spirit and scope of the invention will become apparent to those who skilled in the art from this detailed description.

BRIEF DESCRIPTION OF THE DRAWINGS

The present invention will become more fully understood from the detailed description given herein below and the accompanying drawings which are given by way of illustration only, and thus are not within the limits of the present invention and wherein.

DESCRIPTION OF THE EXEMPLARY EMBODIMENTS

For your esteemed members of reviewing committee to further understand and recognize the fulfilled functions and structural characteristics of the invention, several exemplary embodiments cooperating with detailed description are presented as follows.

Figure 2A:
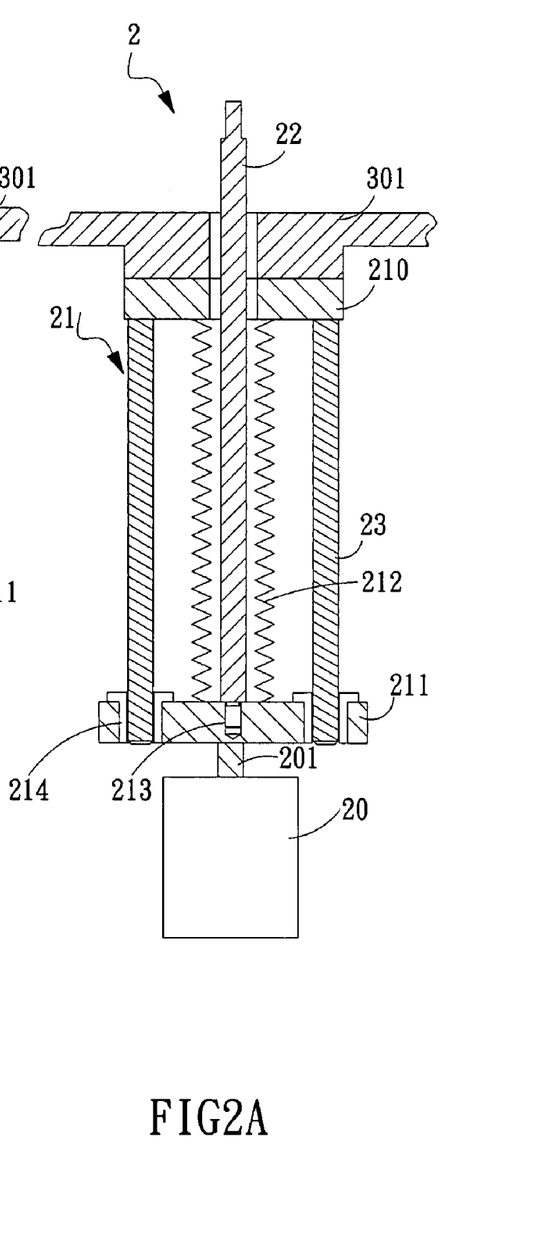
FIG. 2A and FIG. 2B are two cross-sectional diagrams illustrating a power-delivery mechanism according to an exemplary embodiment of the invention.
Figure 2B:
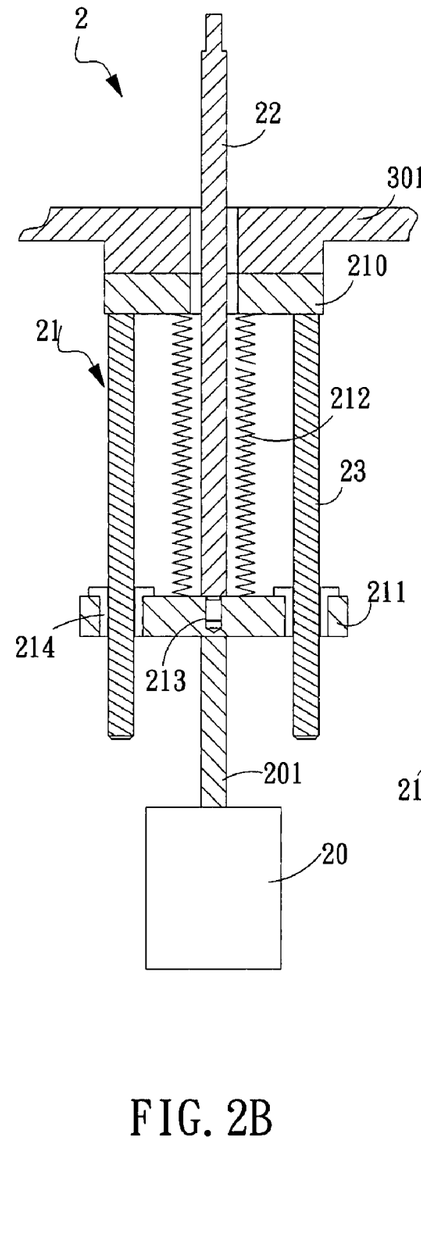

Please refer to FIG. 2A and FIG. 2B, which are two cross-sectional diagrams illustrating a power-delivery mechanism according to an exemplary embodiment of the invention. In FIG. 2A, the power-delivery mechanism 2 comprises: a power unit 20, an airtight flexible unit 21 and a supporting pillar 22. The power unit 20 is used to provide power, which can be a pneumatic cylinder, a motor, or other devices with power output ability. In this exemplary embodiment, the power unit 20 is substantially a pneumatic cylinder. The airtight flexible unit 21 is coupled to the power unit 20 for enabling the same to receive power from the power unit 20. The supporting pillar 22 is disposed inside the airtight flexible unit 21 in a manner that an end thereof is extended outside the airtight flexible unit 21.

The airtight flexible unit 21 further comprises the first supporting plate 210, the second supporting plate 211 and an airtight retractable bush 212. The first supporting plate 210 is fixedly secured on the bottom of a vacuum chamber 301. The second supporting plate 211 is disposed at one side of the first supporting plate 210 while coupling to the power unit 20. The airtight retractable bush 212 is arranged at a position between the first and the second supporting plates 210, 211 in an airtight manner to be used as an extension of the vacuuming of the vacuum chamber 310. In this embodiment, the airtight retractable bush 212 is a bellow. Moreover, the second supporting plate 211 is formed of a fillister 213 at one side thereof for fixedly receiving and securing on an end of the supporting pillar 22 therein. In this embodiment, the fillister 213 is substantially a screw hole, by which the supporting pillar 22 can be screwed into the screw hole as the lower portion of the supporting pillar 22 is formed of screw thread. Thereby, when the supporting pillar 22 is worn out or deformed by heating, it can be replaced easily.

As shown in FIG. 2B, after the power unit 20 is activated for outputting power, the pushing rod 201 of the power unit 20 will push the second supporting plate 211 to force the same to move, bring the supporting pillar 22 to move forward accordingly and thus cause the airtight retractable bush 212 to be compressed. In order to prevent the second supporting plate 211 from rotating during the movement, at least a guiding rod 23 is arranged between the first and the second supporting plates 210, 211 while being positioned at one side of the airtight retractable bush 212 in a manner that the upper end of the guiding rod 23 is secured on the first supporting plate 210 and the lower end of the same is secured on the second supporting plate 211. Thereby, it can be used for assisting and guiding the movement of the second supporting plate 211 and thus preventing the buckling of the airtight retractable bush 212 from being compressed so that it can prevent the damage of the airtight retractable bush 212 from being caused by the friction with the supporting pillar 22.

As the power-delivery mechanism 2 of the invention is designed with airtight and flexible characteristics, it can be integrated with any other vacuum equipments. Thus, it can be used as the core power source for automatizing those processes. The following embodiments show a plasma-enhanced chemical vapor deposition (PECVD) apparatus having the aforesaid power-delivery mechanism 2 embedded therein, which is able to load and unload a workpiece automatically by such a power-delivery mechanism 2.

Figure 3A:
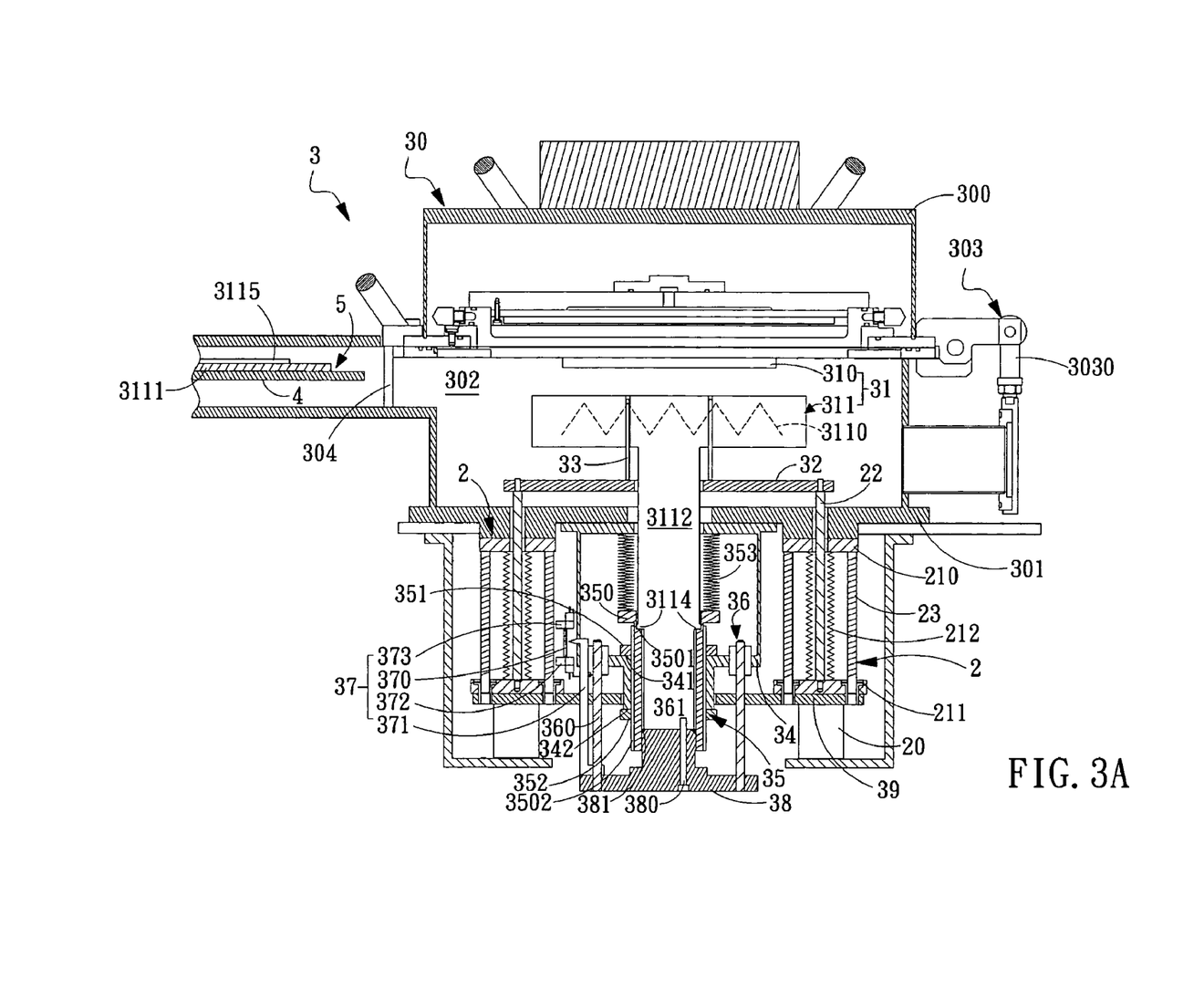
FIG. 3A shows a PECVD apparatus according to an exemplary embodiment of the invention.
Figure 4:
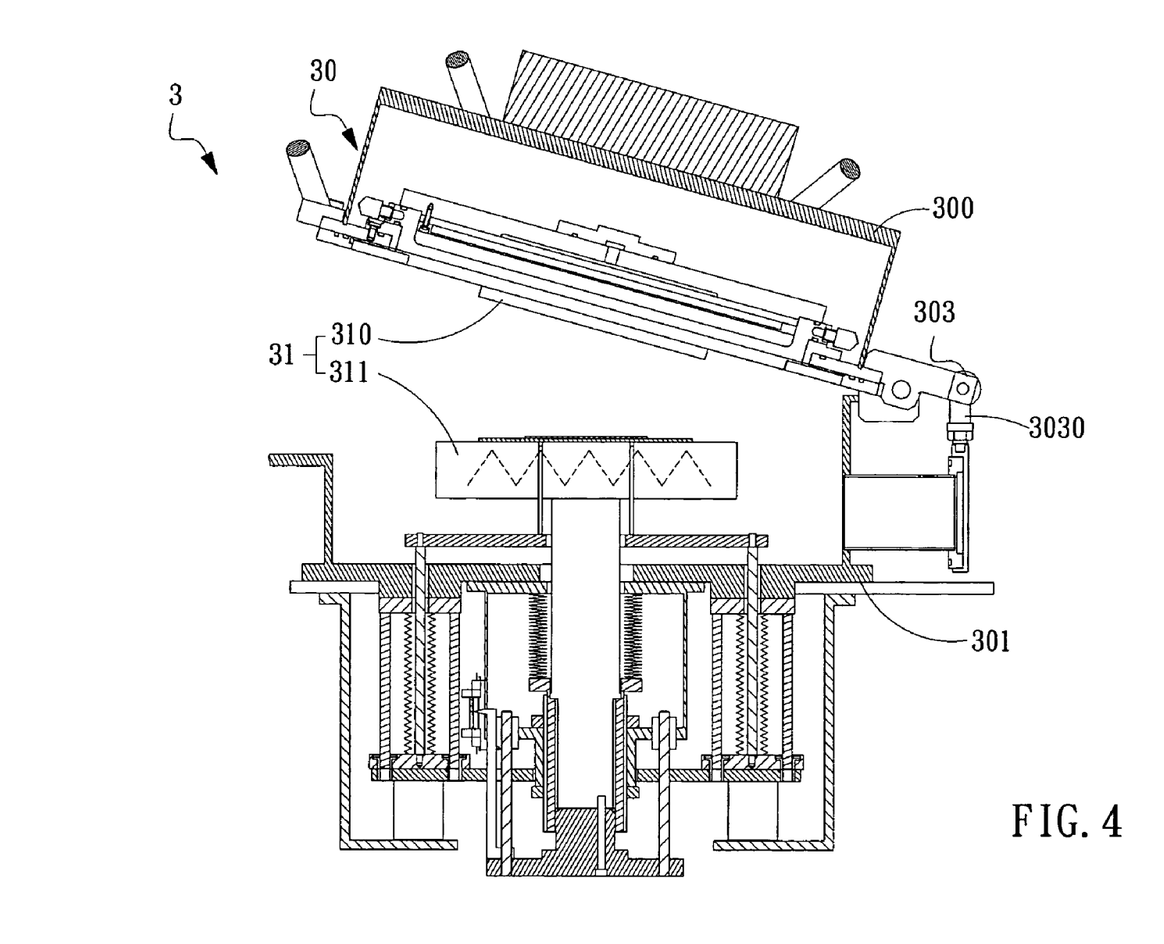
FIG. 4 is a schematic diagram showing a PECVD apparatus of the invention in a state that its chamber is opened.

Please refer to FIG. 3A, which shows a PECVD apparatus according to an exemplary embodiment of the invention. The PECVD apparatus 3 contains a chamber 30, an accommodation space 302, enclosed by a top portion 300 and a base portion 301, and an cover-opening mechanism 303, configured at one side of the chamber 30. In this embodiment, the opening mechanism 303 is pulled by a pneumatic cylinder, and thereby, opens the chamber 30 by lifting the top portion 300, as shown in FIG. 4. In FIG. 3A, an electrode unit is installed inside the chamber 30, which is composed of an upper electrode 310 and a lower electrode 311. It is noted that there can be a heater embedded into the lower electrode 311 to be used as a heat source during a manufacturing process. Moreover, the two electrodes 310, 311 are spaced apart by a specific distance. As the structure of the upper electrode 310 and relating piping are known to those who skilled in the art, they are not described further herein.

As shown in FIG. 3, there can be at least one power-delivery mechanism 2 is connected with the bottom of the lower portion 301, whereas each power-delivery mechanism 2 comprises a power unit 20, an airtight flexible unit 21 and a supporting pillar 22, as shown in FIG. 2A and FIG. 2B, and thus are not described further herein. In order to use those power-delivery mechanisms 2 for simultaneously driving the airtight flexible unit 21 to move up or down, a plate 39 is disposed between each power unit 20 and their corresponding airtight flexible unit 21 while securing the second supporting plate 211 of the airtight flexible unit 21 on the plate 39. Thereby, the power unit 20 can exert a push force upon the plate 39 which can further transmit the force to the airtight flexible unit 21.

Figure 3B:
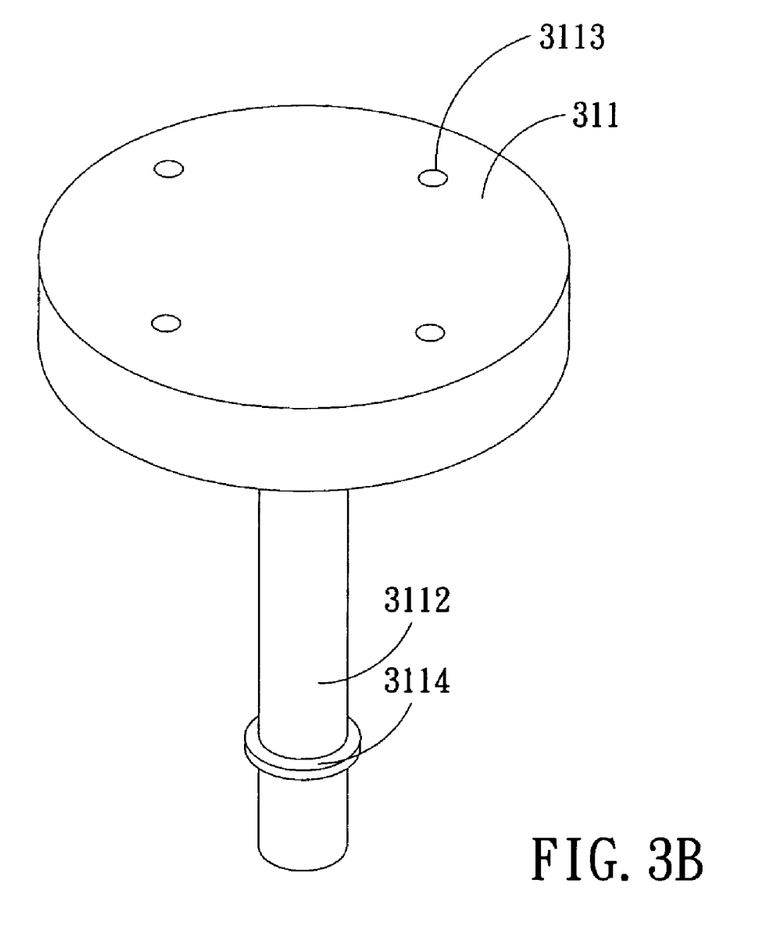
FIG. 3B is a schematic diagram showing a lower electrode of the invention.
Figure 5:
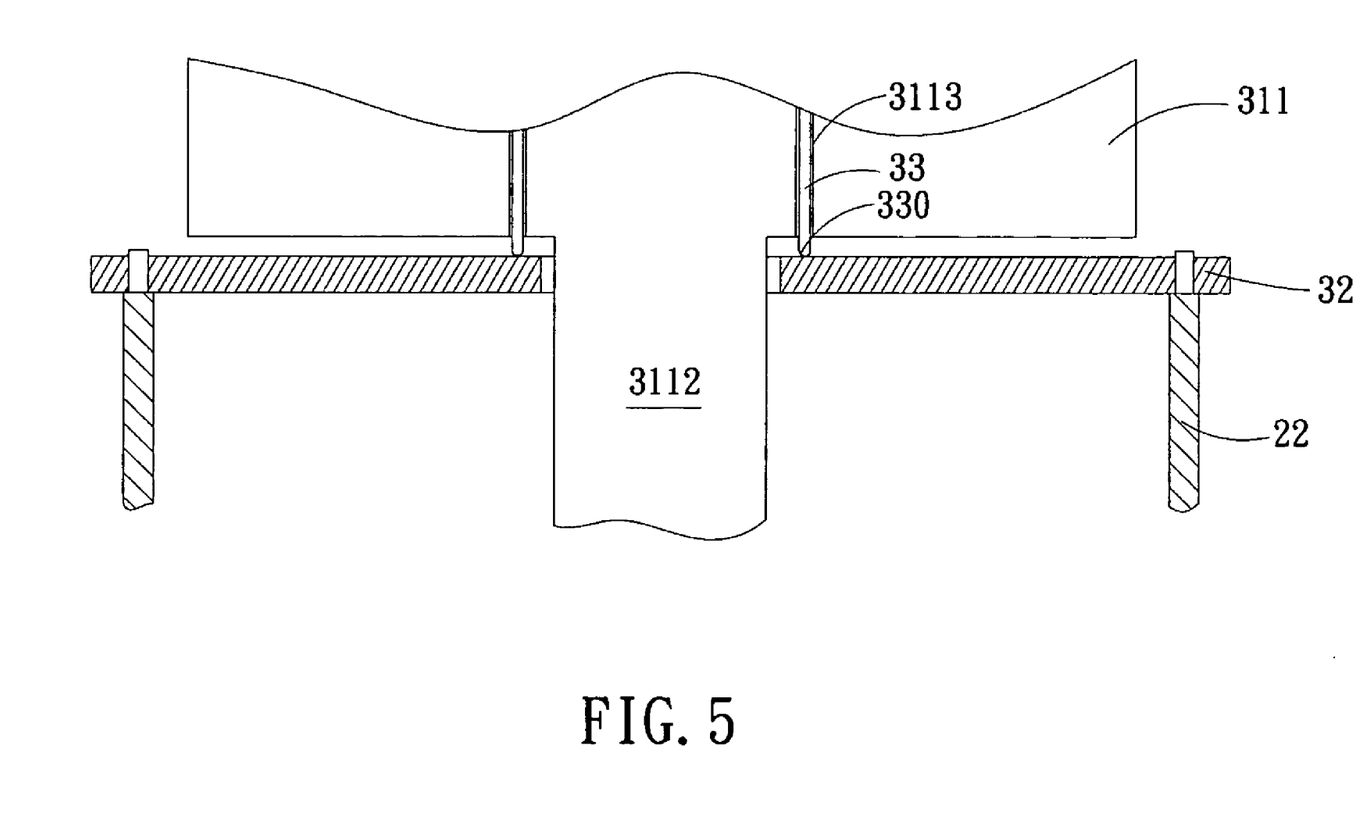
FIG. 5 is a schematic diagram depicting the contacting between a lift pin and a pushing panel according to an embodiment of the invention.

Moreover, a tube 3112 is extendedly disposed under the lower electrode 311 and pierced through the lower portion 301 of the chamber 30. There is a pushing panel 32, mounted on the tube 3112 in a manner that the tube 3112 is surrounded by the pushing panel 32 while the pushing panel 32 is coupled to the supporting pillar 22 of each power-delivery mechanism 2. In addition, there can be at least one via hole 3113 formed on the lower electrode 311, as shown in FIG. 5. As the lower electrode 311 used in this embodiment is disc-shaped, as shown in FIG. 3B, there are four via holes 3113 formed on the lower electrode 311 for loading/unloading a workpiece symmetrically, despite that there are only two via holes 3113, as shown in FIG. 3A. In addition, there is at least one lift pin 33 placed on the pushing panel 32, that each pierces through the via hole 3113 of the lower electrode 311 while keeping an end thereof being placed freely on the pushing panel 32 by its own weight. In FIG. 5, the profile of the end of the lift pin 33 abutting against the pushing panel 32 is an arc 330.

Figure 7:
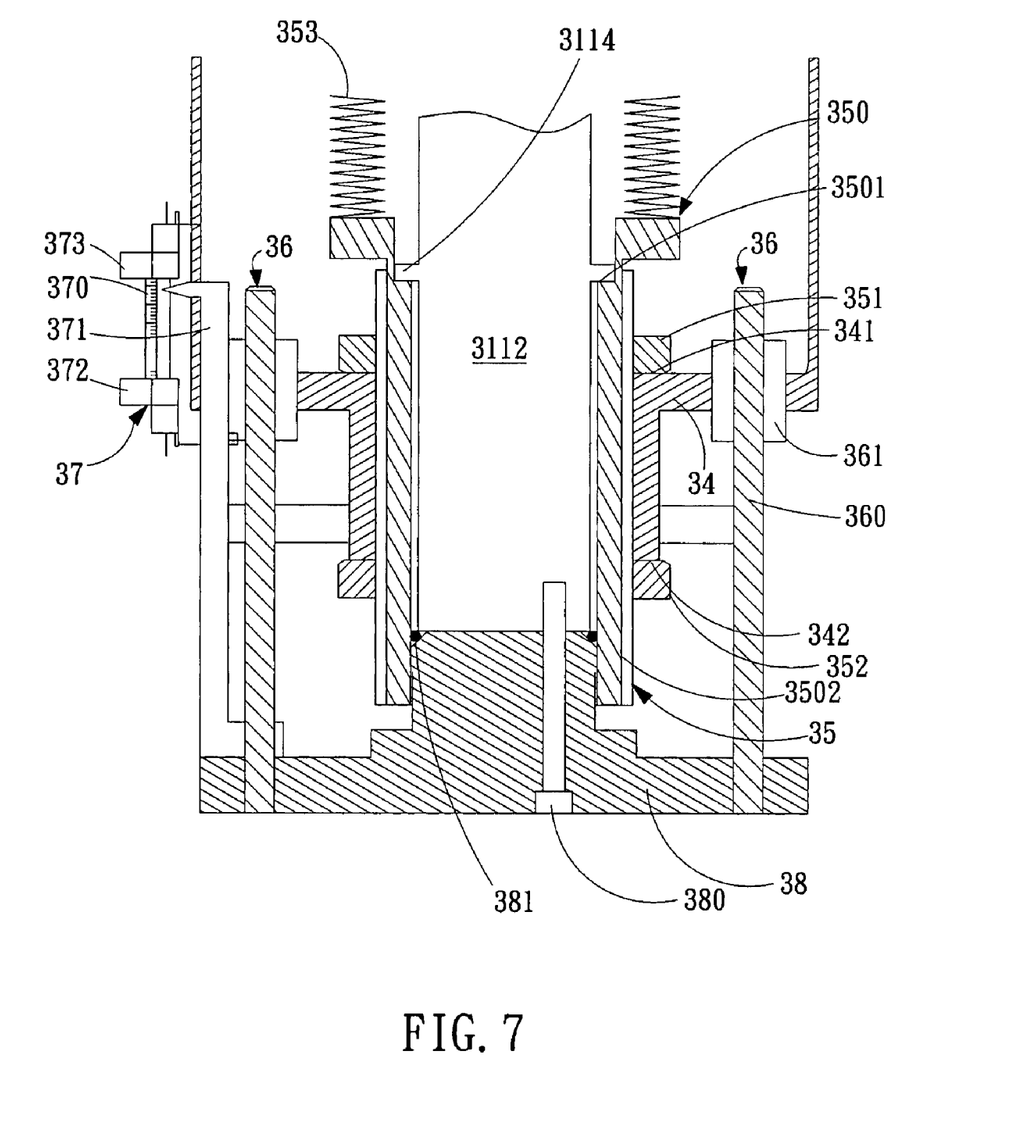
FIG. 7 shows how the position of the lower electrode can be adjusted.

As shown in FIG. 3A and FIG. 7, a supporting seat 34 is connected with the bottom of the lower portion 301 from the outside of the chamber 30. As shown in Figures, the supporting seat 34 and the bottom of the lower portion 301 of the chamber 30 are channelled by a hole, by which the tube 3112 of lower electrode 311 can pierce therethrough. In an exemplary embodiment, there is a height-adjusting unit 35, arranged inside the supporting seat 34 to be used to control the raising and descending of the lower electrode 311. The height-adjusting unit 35 comprises: a base 350 with screw thread 3502 formed on the lower portion of the external periphery thereof, designed for allowing the tube 3112 to pass therethrough while shaped as a flange 3501 on the inner wall thereof to be used to abut against a protruding portion 3114 of the tube 3112; the first locking nut 351 is screwedly mounted to the base 350 while maintaining a tight locking against the bottom 341 of the supporting seat 34; and the second locking nut 352 is screwedly mounted to the base 350 while maintaining a tight locking against the lower rim 342 of the supporting seat 34. For maintaining airtight, there is an airtight retractable bush 353 arranged between the base 350 and the lower portion 301 of the chamber 30.

It is noted that the first locking nut 351 is screwedly mounted to the base 350 while maintaining a tight locking against the bottom 341 of the supporting seat 34, and the second locking nut 352 is screwedly mounted to the base 350 while maintaining a tight locking against the lower rim 342 of the supporting seat 34. Moreover, the tube 3112 is forced to press tightly with the locating ring 38 by a sealing ring 38 and is further fixedly stationed by at least one orientation bolt 380. In addition, there is at least one orientation mechanism 36, arranged at a position between the locating ring 38 and the supporting seat 34, and each further comprises: a guidance element 361, mounted on the supporting seat 34; and an orientation rod 360, having an end fixedly coupled to the locating ring 38 and another end being arranged to slide freely on the guidance element 361.

In order to facilitate operators to be aware of the position of the lower electrode 311 outside the chamber 30, a position-indicating unit 37 is set on the PECVD apparatus 2 of the invention, which comprises: a scale 370, arranged on the outer wall of the supporting seat 34; and a pointer 371, connected with the locating ring 38 and pointing to the graduations of the scale 370. In addition, for preventing the raising/descending of the lower electrode 311 from exceeding the allowable operation ranges, two position sensors 372, 373 are arranged at the upper limit and lower limit of the scale 370 respectively. In this embodiment, both position sensors 372, 373 are photo sensors, by which alarm signals will be released as soon as any of the two photo sensors is shaded by the pointer 371. However, the location of the position-indicating unit 37 is not limited by the aforesaid embodiment, only if the scale 370 is settled down on a stationary part of the apparatus while disposing the pointer 371 on a part that is able to move along with the lower electrode 311, or vice versa.

Moreover, a gate 304 is formed at one side of the chamber 30 to be provided for a robotic arm 4 to enter therein whereas the robotic arm is able to carry a workpiece 5. In this embodiment, the workpiece 5 is a wafer carrier 3111 having a wafer 3115 placed thereon. As the structure of the robotic arm 4 is known to those who skilled in the art, it is not described further herein.

Figure 6A:
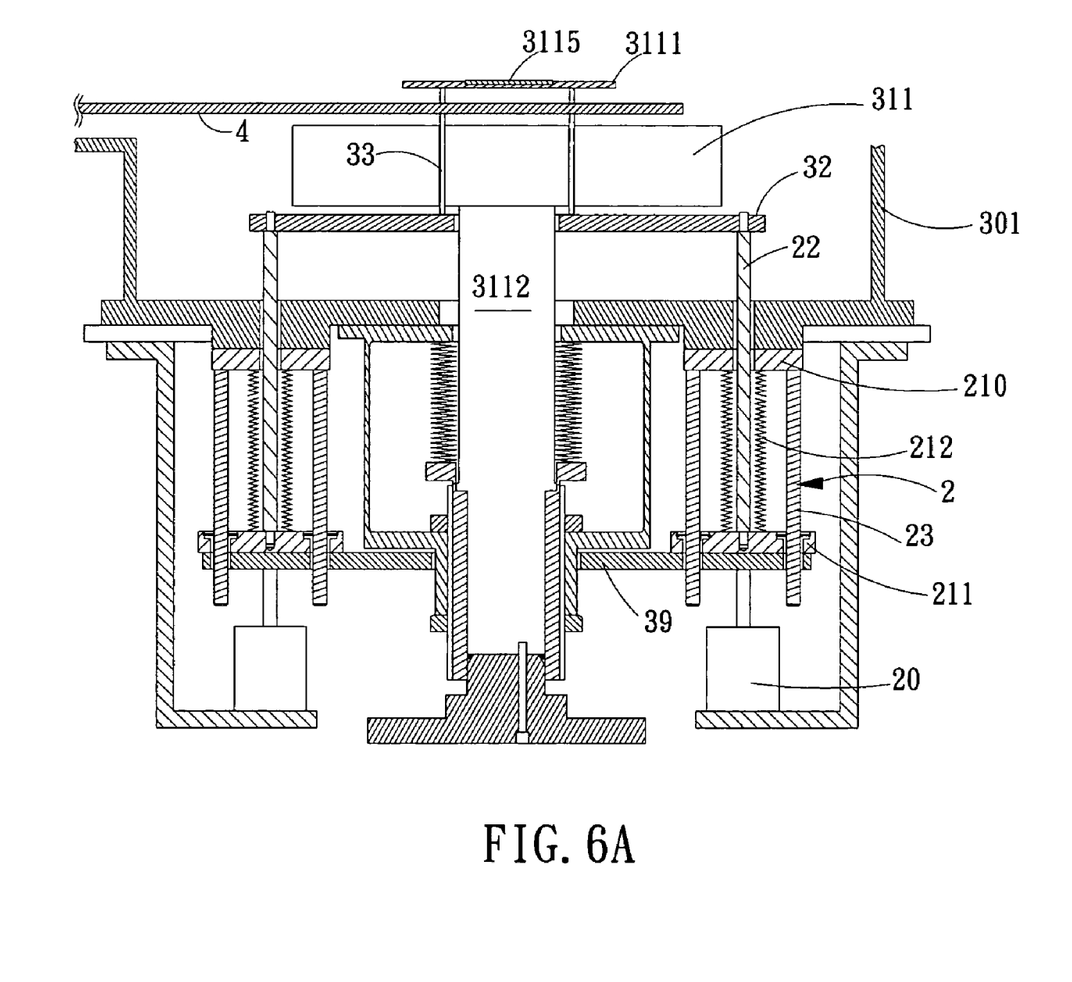
FIG. 6A, FIG. 6B and FIG. 6C show a sequence of successive movements performed in a PECVD apparatus of the invention, whereas the movements are actuated by a power-delivery mechanism of invention.
Figure 6B:
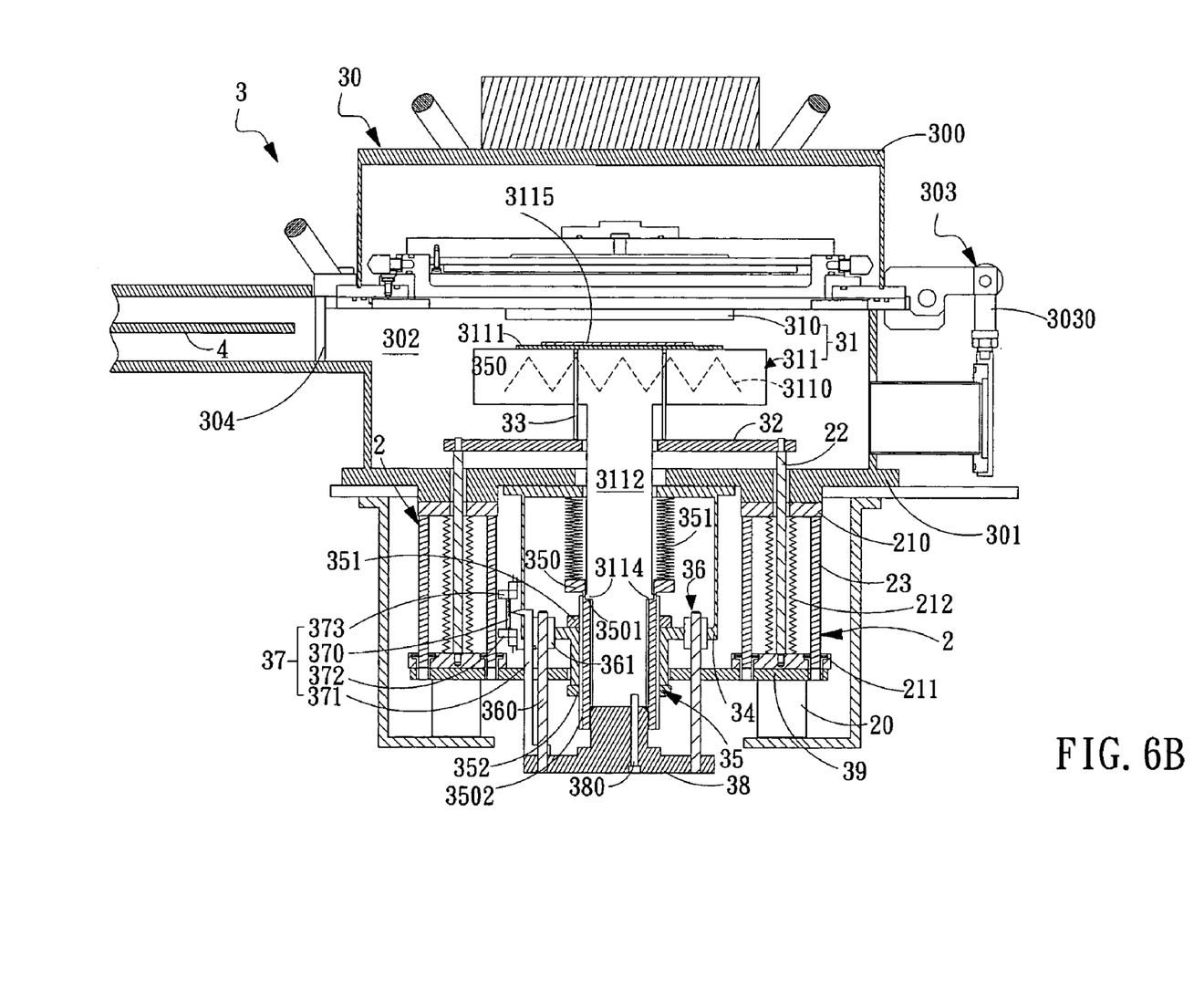
Figure 6C:
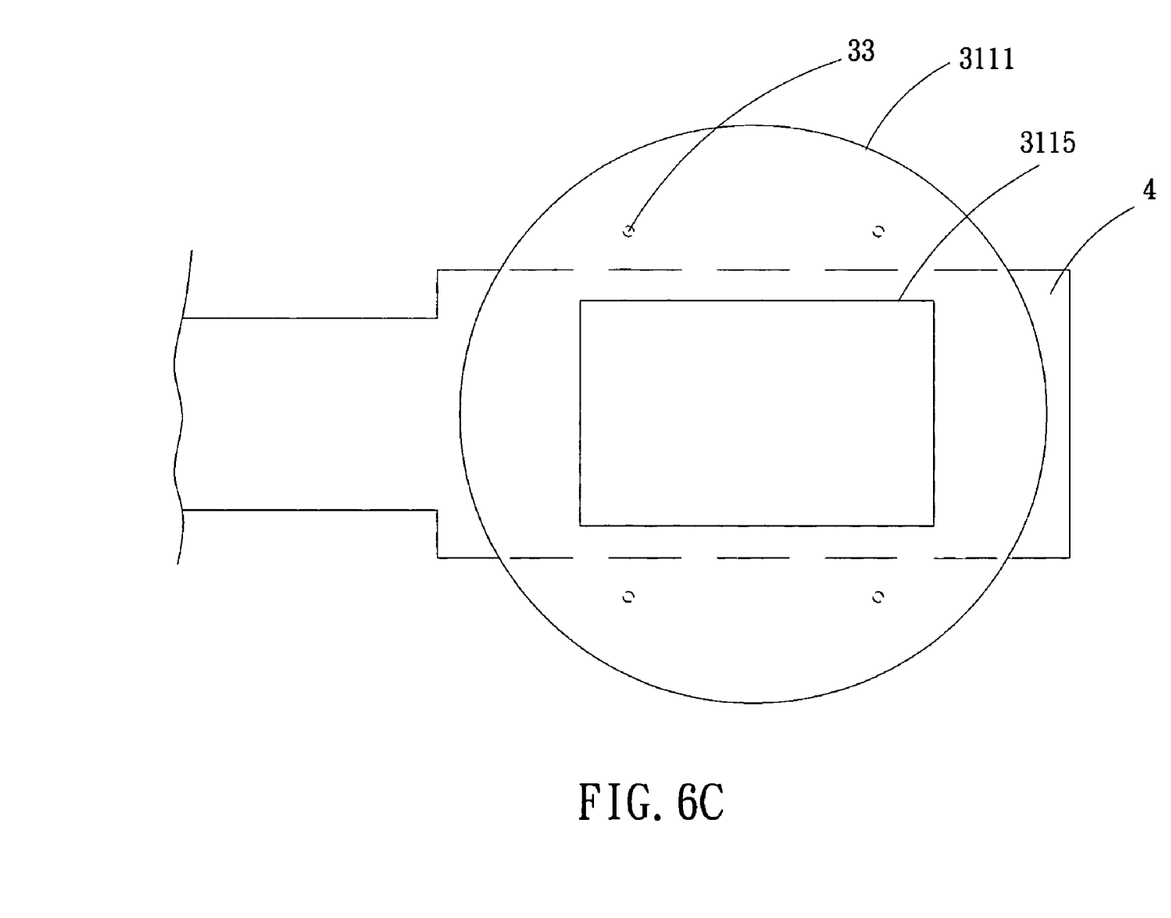

Please refer to FIG. 6A to FIG. 6C, which show a sequence of successive movements performed in a PECVD apparatus of the invention, whereas the movements are actuated by a power-delivery mechanism of this invention. As shown in FIG. 6A, as soon as the robotic arm 4 carries the workpiece 5 to enter the chamber 30 through the gate 304 and is orientated, the power unit 20 of the power-delivery mechanism 2 will be activated to push the plate 39 to move upward, and thereby, the second supporting plate 311 will be moved upward along with the upward-moving plate 39 as it is secured on the plate 39 and thus bring the supporting pillar 22 to move accordingly while compressing the airtight retractable bush 212. As the upward movement of the supporting pillar 22 will push and force the pushing panel 32 to move upward, the lift pin will be driven to move up a specific distance and thus lift the workpiece 5. As soon as the workpiece is lifted, the robotic arm 4 will exit the chamber 30 and back to its initial position. Thereafter, the power unit 20 will drive the plate 39 back to its initial position and thereby bring the supporting pillar 22 to descend. As the descending of the supporting pillar 22 will cause the pushing panel 32 to descend as well, the lift pin 33 will be driven to return to its initial position so that the workpiece 5 will be rested on the lower electrode 311, as shown in FIG. 6B. After the processing of the workpiece 5 placed on the lower electrode 311 is accomplished, a procedure performed by the power-delivery mechanism 2 and the robotic arm 4, reversing to the aforesaid procedure, is performed so as to unload the workpiece 5.

FIG. 7 shows how the position of the lower electrode 311 can be adjusted so as to adjust the distance between the upper electrode 310 and the lower electrode 311. As shown in FIG. 7, the lower electrode 311 is positioned at a specific position away from the upper electrode 310 by the steps listed as following:

loosing the second locking nut 352;

screwing the first locking nut 351 for enabling the first locking nut to move 351 in relative to the external screw thread 3502 of the base 350; and tightly screwing the second locking nut 352 until it is tightly pressed against the lower rim 342 of the supporting seat 34 for fixedly stationing the position of the lower electrode 311.

Figure 8:
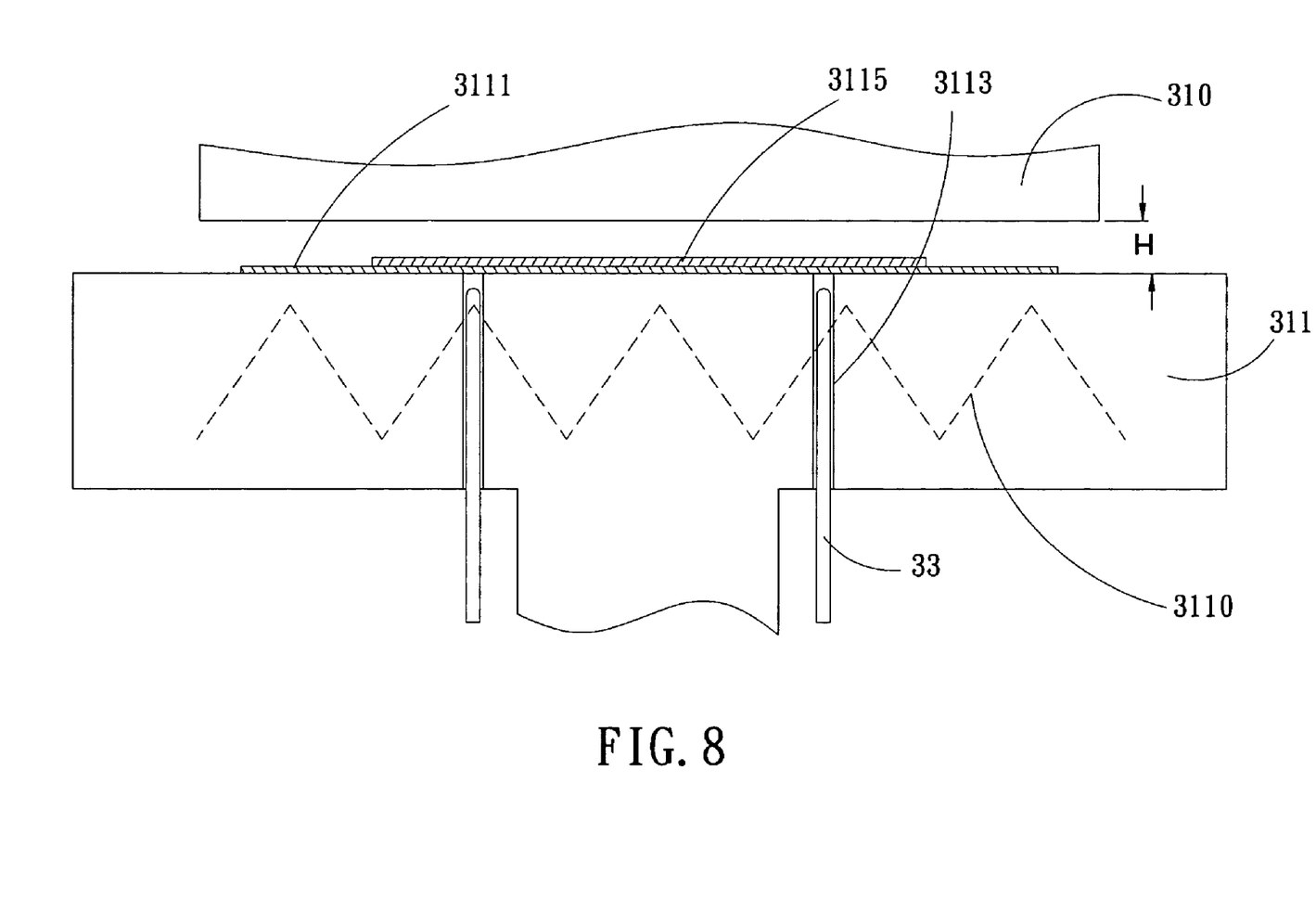
FIG. 8 is a schematic diagram showing the upper electrode being positioned a distance away from the lower electrode.

Thereby, the distance H between the upper electrode 310 and the lower electrode 311 can be adjusted, as that shown in FIG. 8.

Figure 9:
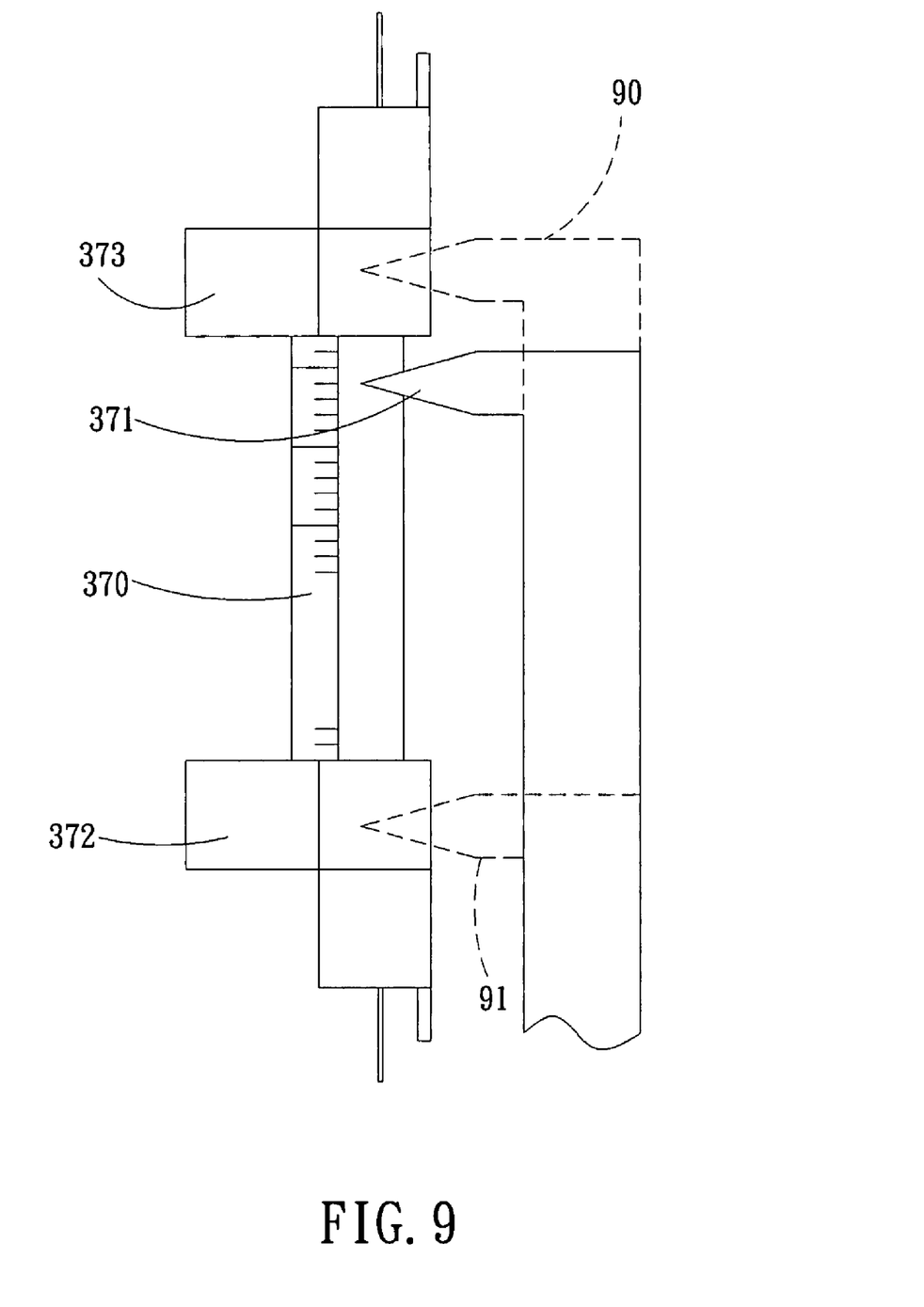
FIG. 9 illustrates the operations of the position-indicating unit of the invention.

It is noted that by using the position-indicating unit 37, an operator is able to know the exact position of the lower electrode 311 and thus can control the distance between the upper and the lower electrodes 310, 311. FIG. 9 illustrates the operations of the position-indicating unit of the invention. For preventing the raising/descending of the lower electrode 311 from exceeding the allowable operation ranges, two position sensors 372, 373 are arranged at the upper limit and lower limit of the scale 370 respectively. By which, an alarm single will be released when the pointer 371 is moved to the location 90 as the sensor 373 is shaded thereby, and when the pointer 371 is moved to the location 91 as the sensor 372 is shaded thereby. Moreover, the operation of the robotic arm 4 can also be controlled by the activation of the two sensors 372, 373 by evaluation if it is safe to enter the chamber 30. For instance, when the position sensor 373 is shaded by the pointer 371, indicating that the lower electrode 311 is very close to the upper electrode 310, it is determined that the robotic arm 4 is unable to enter the chamber 30.

To sum up, the invention provides a PECVD apparatus capable of controlling a workpiece to be raised/descended by using a power-delivery mechanism, which can further be integrated with an automatized transporting device so as to facilitate the automation of the loading/unloading of wafers onto the PECVD apparatus for processing while reducing the chance of the wafer to be contaminated during loading/unloading, and thus not only the productivity can be improved, but also the yield of the PECVD apparatus can be enhanced.

Thus the invention being described, it will be obvious that the same may be varied in many ways. Such variations are not to be regarded as a departure from the spirit and scope of the invention, and all such modifications would be obvious to one who skilled in the art to included within the scope of the following claims.

What is claimed is:

1. A power-delivery mechanism, comprising:
a power unit;
an airtight flexible unit, coupled to the power unit for receiving power therefrom so as to use the received power to perform a motion of linear displacement;
a supporting pillar, disposed inside the airtight flexible unit in a manner that it is movable following the linear motion of the airtight flexible unit while an end thereof is extending outside the airtight flexible unit;
a pushing panel, mounted on the supporting pillar in a manner that its position is moved with the supporting pillar; and
at least one lift pin, with an end thereof being placed freely on the pushing panel by its own weight;
wherein the airtight flexible unit further comprises:
a first supporting plate;
a second supporting plate, disposed at one surface of the first supporting plate while coupling to the power unit and formed as a fillister at another surface thereof opposite to that coupled to the power unit for fixedly receiving and securing an end of the supporting pillar therein;
an airtight retractable bush, arranged at a position between the first and the second supporting plates; and
at least one guiding rod is arranged between the first and the second supporting plates while disposed at the supporting plate which is placed at a position close to the outer rim of the airtight retractable bush.

2. The power-delivery mechanism of claim 1, wherein the power unit is a device selected from the group consisting of a motor and a pneumatic cylinder.

3. The power-delivery mechanism of claim 1, wherein the airtight retractable bush is substantially a bellow.

4. A plasma-enhanced chemical vapor deposition (PECVD) apparatus, comprising:
a chamber;
an electrode unit, containing an upper electrode and a lower electrode embedded with a heater while received inside the chamber;
at least one power-delivery mechanism, each being arranged outside the chamber and further comprising:
a power unit;
an airtight flexible unit, coupled to the power unit for receiving power therefrom so as to use the received power to perform a motion of linear displacement; and
a supporting pillar, disposed inside the airtight flexible unit in a manner that it is movable following the linear motion of the airtight flexible unit while an end thereof is extending outside the airtight flexible unit;
a pushing panel, mounted on the supporting pillar of at least one power-delivery mechanism in a manner that its position is moved with the supporting pillar; and
at least one lift pin, each piercing through the lower electrode while keeping an end thereof being placed freely on the pushing panel by its own weight;
wherein the airtight flexible unit further comprises:
a first supporting plate;
a second supporting plate, disposed at one surface of the first supporting plate while coupling to the power unit and formed as a fillister at another surface thereof opposite to that coupled to the power unit for fixedly receiving and securing an end of the supporting pillar therein;
an airtight retractable bush, arranged at a position between the first and the second supporting plates; and
at least one guiding rod is arranged between the first and the second supporting plates while disposed at the supporting plate which is placed at a position close to the outer rim of the airtight retractable bush.

5. The PECVD apparatus of claim 4, wherein the power unit is a device selected from the group consisting of a motor and a pneumatic cylinder.

6. The PECVD apparatus of claim 4, wherein the lower electrode is arranged in a manner that it is protruded from the bottom of the chamber.

7. The PECVD apparatus of claim 4, wherein the airtight retractable bush is substantially a bellow.

8. The PECVD apparatus of claim 4, further comprising:
a supporting seat, connected with the bottom of the chamber;

a height-adjusting unit, capable of controlling the positioning of the lower electrode as it is disposed inside the supporting seat for supporting the lower electrode;

an airtight retractable bush, arranged at a position between the height-adjusting unit and the bottom of the chamber in a manner that the electrode, protruded outside the bottom of the chamber, is allowed to pass through the airtight retractable bush; and a locating ring, abutting against the bottom of the lower electrode.

9. The PECVD apparatus of claim 8, wherein the height-adjusting unit further comprises:

a base with screw thread formed on the lower portion of the external periphery thereof, designed for allowing the lower electrode to pass therethrough while structured with a flange on the inner wall thereof to be used for abutting against a protruding portion formed on the lower electrode;

a first locking nut, capable of being screwedly mounted on the base while maintaining a tight locking against the bottom of the supporting seat; and a second locking nut, capable of being screwedly mounted on the base while maintaining a tight locking against the lower rim of the supporting seat;

wherein, the lower electrode is raised to a specific position by the steps listed as following:

loosing the second locking nut;

screwing the first locking nut for enabling the first locking nut to move in relative to the external screw thread of the base; and tightly screwing the second locking nut until it is tightly pressed against the lower rim of the supporting seat for fixedly stationing the position of the lower electrode;

and the lower electrode is lowered to a specific position by the steps listed as following:

loosing the first locking nut;

tightly screwing the second locking nut upwardly for forcing the lower electrode to descend.

10. The PECVD apparatus of claim 8, wherein at least a locating bolt is arranged between the locating ring and the lower electrode protruding the bottom of the chamber.

11. The PECVD apparatus of claim 8, wherein the height-adjusting unit further comprises:

at least an orientation mechanism, each arranged at a position between the locating ring and the supporting seat, each further comprised:

a guidance element, mounted on the supporting seat; and a orientation rod, having an end fixedly coupled to the locating ring and another end being arranged to slide freely on the guidance element.

12. The PECVD apparatus of claim 8, wherein the lower electrode further comprises a tube, which is forced to press tightly with the locating ring by a sealing ring and is further fixedly stationed by using at least one orientation bolt.

13. The PECVD apparatus of claim 8, further comprising a position-indicating unit, which comprises:

a scale, arranged on the outer wall of the supporting seat;

a pointer, connected with the locating ring and pointing to the graduations of the scale; and two position sensors, respectively mounted at the two ends of the scale.

14. The PECVD apparatus of claim 8, wherein the airtight retractable bush is substantially a bellow.

15. The PECVD apparatus of claim 4, further comprising:

a transporting arm, arranged at one side of the chamber and used to carry a wafer carrier having a wafer placed thereon.

16. The PECVD apparatus of claim 4, wherein the profile of the end of the lift pin abutting against the pushing panel is an arc.

* * * * *